United States Patent
Chen et al.

(10) Patent No.: US 10,497,560 B2
(45) Date of Patent: Dec. 3, 2019

(54) UNIFORMITY CONTROL FOR SI DOT SIZE IN FLASH MEMORY

(71) Applicant: Taiwan Semiconductor Manufacturing Co., Ltd., Hsin-Chu (TW)

(72) Inventors: Chih-Ming Chen, Hsinchu (TW); Tsu-Hui Su, Taipei (TW); Szu-Yu Wang, Hsinchu (TW); Chung-Yi Yu, Hsin-Chu (TW); Chia-Shiung Tsai, Hsin-Chu (TW); Ru-Liang Lee, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 6 days.

(21) Appl. No.: 14/261,539

(22) Filed: Apr. 25, 2014

(65) Prior Publication Data
US 2015/0311300 A1 Oct. 29, 2015

(51) Int. Cl.
*H01L 29/423* (2006.01)
*H01L 21/02* (2006.01)
*H01L 21/28* (2006.01)

(52) U.S. Cl.
CPC .. *H01L 21/02271* (2013.01); *H01L 21/28273* (2013.01); *H01L 29/42328* (2013.01); *H01L 29/42332* (2013.01)

(58) Field of Classification Search
CPC ......... H01L 21/02271; H01L 21/28273; H01L 29/42328; H01L 29/42332
USPC ............ 438/257–267; 257/298, 314–326, 14
See application file for complete search history.

(56) References Cited

U.S. PATENT DOCUMENTS

| | | | |
|---|---|---|---|
| 5,852,306 A | 12/1998 | Forbes | |
| 6,774,061 B2 | 8/2004 | Coffa et al. | |
| 7,101,760 B1* | 9/2006 | Lojek | 438/260 |
| 7,579,646 B2 | 8/2009 | Wang et al. | |
| 2002/0140022 A1 | 10/2002 | Lin et al. | |
| 2003/0075756 A1 | 4/2003 | Suzuki | |
| 2006/0046383 A1 | 3/2006 | Chen et al. | |
| 2006/0251561 A1* | 11/2006 | Farrell et al. | 423/324 |
| 2007/0145468 A1 | 6/2007 | Majumdar et al. | |

(Continued)

OTHER PUBLICATIONS

Jan Schmidt, et al.; "Surface Passivation of Silicon Solar Cells Using Plasma-Enhanced Chemical-Vapour-Deposited SiN Films and Thin Thermal SiO2/Plasma SiN Stacks"; Semiconductor Science and Technology; 2001; p. 164-170.

(Continued)

*Primary Examiner* — Ori Nadav
(74) *Attorney, Agent, or Firm* — Eschweiler & Potashnik, LLC (57) ABSTRACT

Some embodiments of the present disclosure relate to a method for forming flash memory. In this method, a tunnel oxide is formed over a semiconductor substrate. A layer of silicon dot nucleates is formed on the tunnel oxide. The layer of silicon dots includes silicon dot nucleates having respective initial sizes which differ according to a first size distribution. An etching process is performed to reduce the initial sizes of the silicon dot nucleates so reduced-size silicon dot nucleates have respective reduced sizes which differ according to a second size distribution. The second size distribution has a smaller spread than the first size distribution.

20 Claims, 12 Drawing Sheets

(56) References Cited

U.S. PATENT DOCUMENTS

| | | | |
|---|---|---|---|
| 2008/0121966 | A1 | 5/2008 | Muralidhar et al. |
| 2009/0039407 | A1 | 2/2009 | Vora |
| 2010/0155909 | A1 | 6/2010 | Ramappa et al. |
| 2011/0263129 | A1* | 10/2011 | Shin et al. ............ 438/746 |
| 2012/0267616 | A1* | 10/2012 | Jang et al. ............ 257/40 |
| 2012/0267699 | A1 | 10/2012 | Kiyotoshi |
| 2012/0292683 | A1 | 11/2012 | Loiko et al. |
| 2013/0207053 | A1 | 8/2013 | Gonen Williams et al. |
| 2013/0207174 | A1 | 8/2013 | Wang et al. |

OTHER PUBLICATIONS

John Phelan; "Investigating the Influence of Interface and Vacancy Defects on the Growth of Silicon Quantum Dots in SiO2"; The School of Graduate and Postdoctoral Studies, The University of Western Ontario; 2013; p. 1-53.

U.S. Appl. No. 14/583,291, filed Dec. 26, 2014.

P. Chakraborty, et al.; "Nanocrystal Non-Volatile Flash Memory Devices: A Simulation Study"; IETE Mumbai Centre, Electronics and ECE Department, Kharagpur, India; 2007; p. D-46-D-50.

Wang, et al. "Efficient One-Pot Synthesis of Highly Photoluminescent Alkyl-Functionalised Silicon Nanocrystals." Chem, Commun., 2011, 47, 4941-4943. Published in 2011.

Wang, et al. "A General Strategy for Nanocrystal Synthesis." Nature. vol. 437, Sep. 1, 2005, doi:10.1038/nature03968.

Bigioni, et al. "Kinetically Driven Self Assembly of Highly Ordered Nanoparticlemonolayers." Nature Materials, vol. 5, Apr. 2006.

Sletnes, et al. "Octoxy Capped Si Nanoparticles Synthesized by Homogeneous Reduction of SiCl4 with Crown Ether Alkalide." Royal Society of Chemistry, Dalton Trans., 2014, 43, 2127. Published in 2014.

U.S. Appl. No. 14/308,808, filed Jun. 19, 2014.

Crippa, et al. "Nonvolatile Memories: NOR vs. NAND Architectures." Memories in Wireless Systems, Springer-Verlag Berlin Heidelberg, 2008.

Li, et al. "Fabrication and Properties of Nano-Si Quantum Dot Flash Memory." Solid-State and Integrated Circuit Technology, 2006. ICSICT '06. 8th International Conference. Oct. 2006.

Muralidhar, et al. "A 6V Embedded 90nm Silicon Nanocrystal Nonvolatile Memory." Electron Devices Meeting, 2003. IEDM '03 Technical Digest. IEEE International. Dec. 2003.

www.semiconductor-today.com "Flash Fast Forward to Quantum Dot Memory." Semiconductor Today—Compounds and Advanced Silicon, vol. 3, Issue 5, Jun. 2008.

Chang, Ko Min. "SG-TFS: a Versatile Embedded Flash with Silicon Nanocrystals as the Storage Medium." Solid-State and Integrated-Circuit Technology, 2008. ICSICT 2008. 9th International Conference. Oct. 2008.

U.S. Appl. No. 14/489,902, filed Sep. 18, 2014.

Non Final Office Action dated Sep. 25, 2015 U.S. Appl. No. 14/489,902.

Final Office Action dated Feb. 16, 2016 U.S. Appl. No. 14/308,808.

Notice of Allowance dated Mar. 21, 2016 U.S. Appl. No. 14/489,902.

Non Final Office Action dated Oct. 14, 2015 U.S. Appl. No. 14/308,808.

Non Final Office Action dated Apr. 21, 2016 U.S. Appl. No. 14/583,291.

Final Office Action received on May 11, 2017 in connection with U.S. Appl. No. 14/583,291.

Non Final Office Action dated Jul. 7, 2016 U.S. Appl. No. 14/308,808.

Notice of Allowance dated Oct. 7, 2016 U.S. Appl. No. 14/308,808.

Final Office Action dated Jul. 29, 2016 U.S. Appl. No. 14/583,291.

Notice of Allowance received on Nov. 3, 2017 in connection with U.S. Appl. No. 14/583,291.

* cited by examiner

UNIFORMITY CONTROL FOR SI DOT SIZE IN FLASH MEMORY

BACKGROUND

Flash memory is used in a wide variety of electronic applications. Some flash memory cells utilize a floating gate field-effect transistor (FET), which stores one or more bits of data in the form of an electric charge within a "floating" gate. The floating gate resides above a channel of, and below a control gate of, the FET, but is electrically-isolated from both by an oxide layer. The memory cell stores charge when the FET is in an "on" state (i.e., when current flows between the source and drain) by applying a voltage to the control gate, which causes electrons to tunnel from the channel into the floating gate. Because the floating gate is electrically-isolated from the channel and the control gate, electrons that tunnel into it will remain there indefinitely.

Electric charge trapped within the floating gate screens the electric field from the control gate within the channel, which selectively changes the threshold voltage ($V_t$) of the FET. For flash memory devices that use an array of memory cells, the stored data can be read out of the array by measuring which cells have a higher $V_t$ (e.g., store a "1") and which have a lower $V_t$ (e.g., store a "0"). Multi-bit cells are also possible, where a single memory cell has more than two discrete $V_t$ states corresponding to more than two data states.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-5A illustrate a series of perspective views that collectively depict an embodiment consistent with FIG. 1's methodology.

FIGS. 2B-5B illustrate charts depicting size distributions for Si dots for the perspective views of FIGS. 2A-5A, respectively.

DETAILED DESCRIPTION

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although some flash memories use floating gates, other flash memories use charge trapping layers to control the $V_t$ of a given flash memory cell. These charge trapping layers operate in largely the same basic manner as conductive gate electrodes, except that charge trapping layers do not need to be conductive. For example, one type of charge trapping layer is a nitride layer, sandwiched between two oxide layers (i.e., an oxide-nitride-oxide (ONO) charge trapping layer), while another type of charge trapping layer is a layer of silicon dots which are sometimes referred to as silicon nanocrystals. Charge, in the form of electrons or holes, can become selectively trapped on (or selectively stripped from) the layer of silicon dots based on the bias conditions applied to the flash memory cell. Ideally, for each flash memory cell, the layer of silicon dots would store the same discrete charge levels for respective programmed data states. However, because the individual silicon dots have sizes that vary, sometimes widely, from one another, some cells have a tendency to store charge more easily while other cells tend to be more difficult to trap charge on. Hence, even when the same bias conditions are applied to flash cells with Si dots as a charge-trapping layer, the Vts of the flash memory cells can vary due to size variations of Si dots. Therefore, it would be desirable to produce a flash memory device that includes a layer of silicon dots that collectively exhibit a relatively uniform size distribution across the silicon dots.

Figure 1:
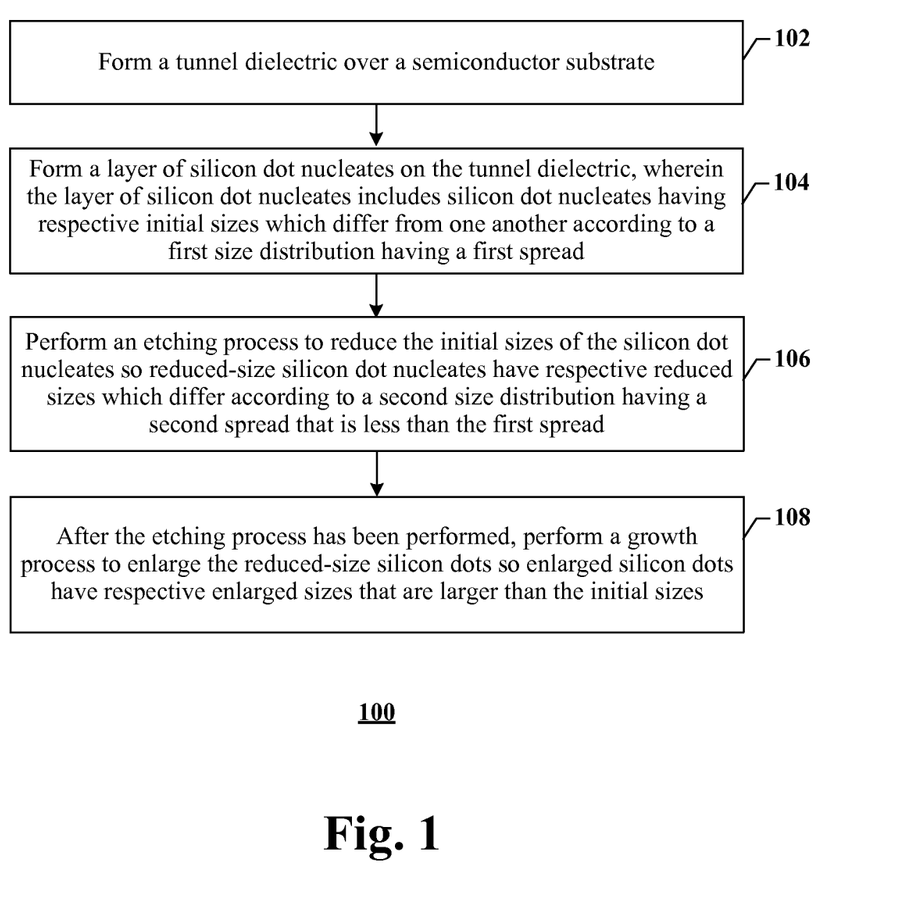
FIG. 1 illustrates a flow chart depicting a method of providing a charge trapping dielectric layer that includes Si dots in accordance with some embodiments.

FIG. 1 shows a method for forming a layer of silicon dots with a relatively uniform size distribution in accordance with some embodiments. At 102, a tunnel oxide is formed over a semiconductor substrate. At 104, a layer of silicon dot nucleates are formed on the tunnel oxide. The silicon dot nucleates have respective initial sizes which differ from one another according to a first size distribution. At 106, an etching process in carried out to reduce the initial sizes of the silicon dot nucleates. These reduced-size silicon dot nucleates have respective reduced sizes which differ from one another according to a second size distribution, which has a smaller spread than the first size distribution. In 108, after the etching process has been performed, a growth process is performed to enlarge the reduced sizes of the reduced-size silicon dots so enlarged silicon dots have respective enlarged sizes that are larger than the initial sizes. Due to the use of the etching process 106, which "tightens" the size distribution of the Si dots, this growth process 108 results in flash memory cells with enlarged Si dots that are relatively uniform in size. Hence, compared to previous approached, the resultant layer of Si dots exhibits more uniform charge trapping capabilities and, consequently, more uniform threshold voltage state variation for the memory cells. For example, large variations in Si dot size can cause a corresponding variation in charge trapping ability and threshold voltage variation. By providing silicon dots with more uniform sizes (i.e., lower variation in silicon dot size), the present disclosure allows the flash memory cells to operate at lower voltages for a given number of data states, have more data states for a given memory cell for a fixed operating voltage, and/or have increased guard-bands between adjacent stored data states—any and all of which tend to improve performance.

FIGS. 2A-5A illustrate a series of perspective views that collectively depict an embodiment consistent with FIG. 1's methodology. FIGS. 2B-5B illustrate charts depicting size distributions for the perspective views of FIGS. 2A-5A, respectively. For example, FIG. 2B depicts a size distribution for FIG. 2A's perspective view; FIG. 3B depicts a size distribution for FIG. 3A's perspective view; and so on.

Figure 2A:
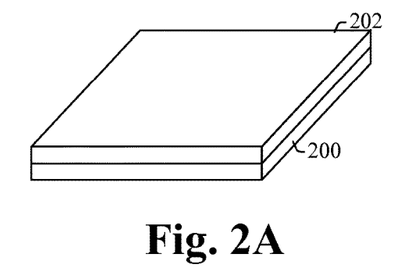

In FIG. 2A, a silicon substrate 200 with a first tunnel dielectric layer 202 is provided. In the embodiment illustrated and described below, the semiconductor substrate 200 is referred to as being a silicon substrate. However, the semiconductor substrate 200 in more general terms may be a bulk semiconductor (e.g., silicon) wafer, a binary compound substrate (e.g., a GaAs wafer), a ternary compound substrate (e.g., AlGaAs), or higher order compound wafers, among others. Further, semiconductor substrate 200 can also include non-semiconductor materials such as oxide in silicon-on-insulator (SOI), partial SOI substrate, polysilicon, amorphous silicon, or organic materials, among others. In some embodiments, the semiconductor substrate 200 can also include multiple wafers or dies which are stacked or otherwise adhered together. The semiconductor substrate 200 can include wafers which are cut from a silicon ingot, and/or any other type of semiconductor/non-semiconductor and/or deposited or grown (e.g., epitaxial) layers formed on an underlying substrate.

Figure 2B:
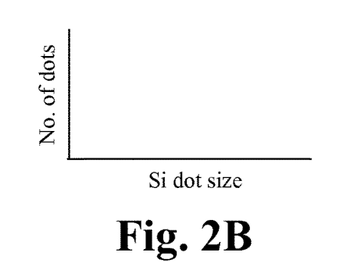

As shown in FIG. 2B, the surface of first tunnel dielectric layer 202 can be initially provided substantially free of silicon dot nucleates. In some embodiments, the first tunnel dielectric layer 202 is an oxide layer, such as $SiO_2$, having a thickness that is less than approximately 100 Angstroms thick.

Figure 3A:
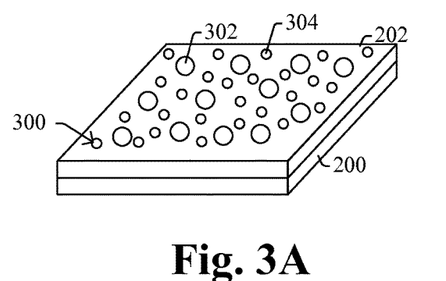
Figure 3B:
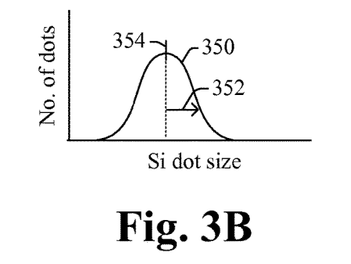

In FIG. 3A, a layer of silicon dot nucleates 300 are formed on an upper surface of the tunnel dielectric 202. The silicon dot nucleates have respective initial sizes which differ from one another according to a first size distribution 350, as shown in FIG. 3B. Within this first size distribution 350, individual initial silicon dot nucleates, which are spherical or spherical-like in shape, have diameters ranging from approximately 3 nm to approximately 10 nm. Thus, a first silicon dot nucleate 302 can have a first diameter of approximately 10 nm, while a second, smaller silicon dot nucleate 304 can have a second diameter of approximately 4 nm or 5 nm. In particular, the illustrated first size distribution 350 shows the sizes of the silicon dot nucleates in layer 300 can be approximately Gaussian, with the greatest number of dots having a mean dot size 354, for example, a mean dot diameter of between approximately 6 nm and approximately 7 nm. The first size distribution 350 has a first spread 352, or sigma, of approximately 50%. Thus, if the mean dot diameter 354 is 6.5 nm; there are a significant number of other Si dots having dot diameters of (6.5 nm+/−50%*6.5 nm), or equivalently 3.25 nm or 9.75 nm.

In some embodiments, these silicon dot nucleates 300 of FIG. 3A can be formed in a low-pressure chemical vapor deposition (LPCVD) process. In some of these embodiments, a $SiH_4$ or $Si_2H_6$ gas flow of less than 100 sccm, an Ar or $N_2$ carrier gas rate of 20000 sccm, and a pressure of less than approximately 200 Torr. can be used during LPCVD processing. The time for this process depends on the pressure used, but can be less than 200 seconds in some embodiments.

Figure 4A:
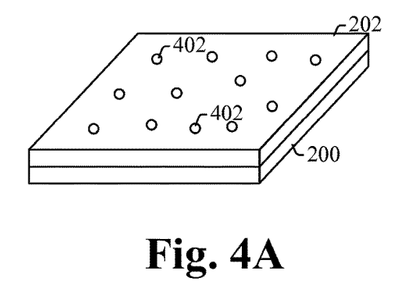
Figure 4B:
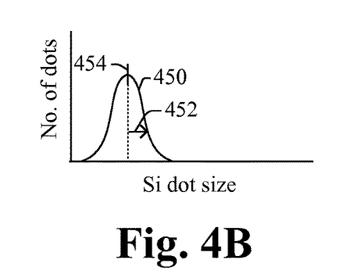

At FIG. 4A, an etching process has been carried out to reduce the sizes of the initial silicon dot nucleates and to concurrently "tighten" their size distribution. Thus, the "small" Si dot nucleates (e.g., 304 from FIG. 3A) can be removed, with the other "larger" Si dot nucleates (e.g., 302 from FIG. 3A) can be reduced in size. For example, the size of the first silicon dot nucleate (302, FIG. 3A), which had a diameter of approximately 10 nm, can be reduced in size to provide reduced size silicon dot nucleate 402 having a diameter of approximately 5-6 nm; while the second, smaller silicon dot nucleate (304, FIG. 3A) can be completely removed from the surface of tunnel dielectric 202. After the etching process is completed, the sizes of the silicon dot nucleates differ from one another according to a second size distribution 450, as shown in FIG. 4B. This second size distribution 450 has a second spread 452, which is smaller than the first spread 352 of the first size distribution 350. In some embodiments, the second spread 452 is approximately 30% or less than the first spread 352. Thus, if the mean dot diameter 454 is 4.5 nm; there are a significant number of other Si dots having dot diameters of (4.5 nm+/−30%*4.5 nm), or equivalently between 3 nm and 6 nm. In still other embodiments, the second spread 452 can be approximately 20% or less than the first spread 352, meaning that if the mean dot diameter 454 is 4.5 nm; there are a significant number of other Si dots having dot diameters of (4.5 nm+/−20%*4.5 nm), or equivalently between 3.6 nm and 5.4 nm.

In some embodiments, the etching process utilized in FIG. 4A is an in-situ dry etch, such as a plasma etch, but this etching process can also be an ex-situ dry etch, such as a plasma etch. In some embodiments, the etching process can be formed in a LPCVD process. In some of these embodiments, a $SiH_4$ or $Si_2H_6$ gas flow of less than 100 sccm, an Ar or $N_2$ carrier gas rate of 20000 sccm, and a pressure of less than approximately 200 Torr. can be used during LPCVD processing. The time for this process depends on the pressure used, but can be less than 200 seconds in some embodiments.

Figure 5A:
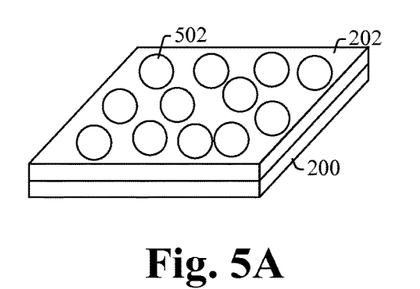
Figure 5B:
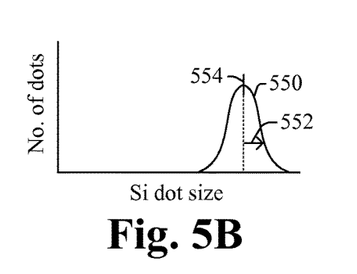

In FIG. 5A, after the etching process has been performed, a growth process is performed to provide enlarged silicon dots 502 having respective enlarged sizes that are larger than the initial sizes. In some embodiments, this growth process occurs with formation of few or no additional silicon dot nucleates, but rather only enlarges the existing silicon dot nucleates. For example, in some embodiments, the enlarged silicon dots 502 have mean diameters of approximately 20 nm with individual diameters that range from approximately 16 nm to approximately 24 nm, with substantially zero silicon dots having diameters of less than 3 nm and substantially zero silicon dots have diameters of greater than 37 nm. This is shown in FIG. 5B, wherein which shows a third size distribution 550 for the enlarged silicon dots having a third spread 552 that is smaller than the first spread 352, and approximately equal to the second spread 452. The mean dot diameter 554 is increased relative to mean dot diameters 354, 454.

In some embodiments, the growth process utilized in FIG. 5A comprises flowing $Si_2H_6$ as a precursor gas at a flow rate of less than approximately 200 sccm and flowing He gas as a carrier gas at flow at less than 2000 sccm, then performing LPCVD at a pressure of less than 100 Torr and a temperature of less than 550° C. Other carrier precursor gases, precursor gases, pressures, and temperatures could also be used. For example, $SiH_6/Cl_2$ could also be used as a precursor gas with He carrier gas in other embodiments.

Figure 6:
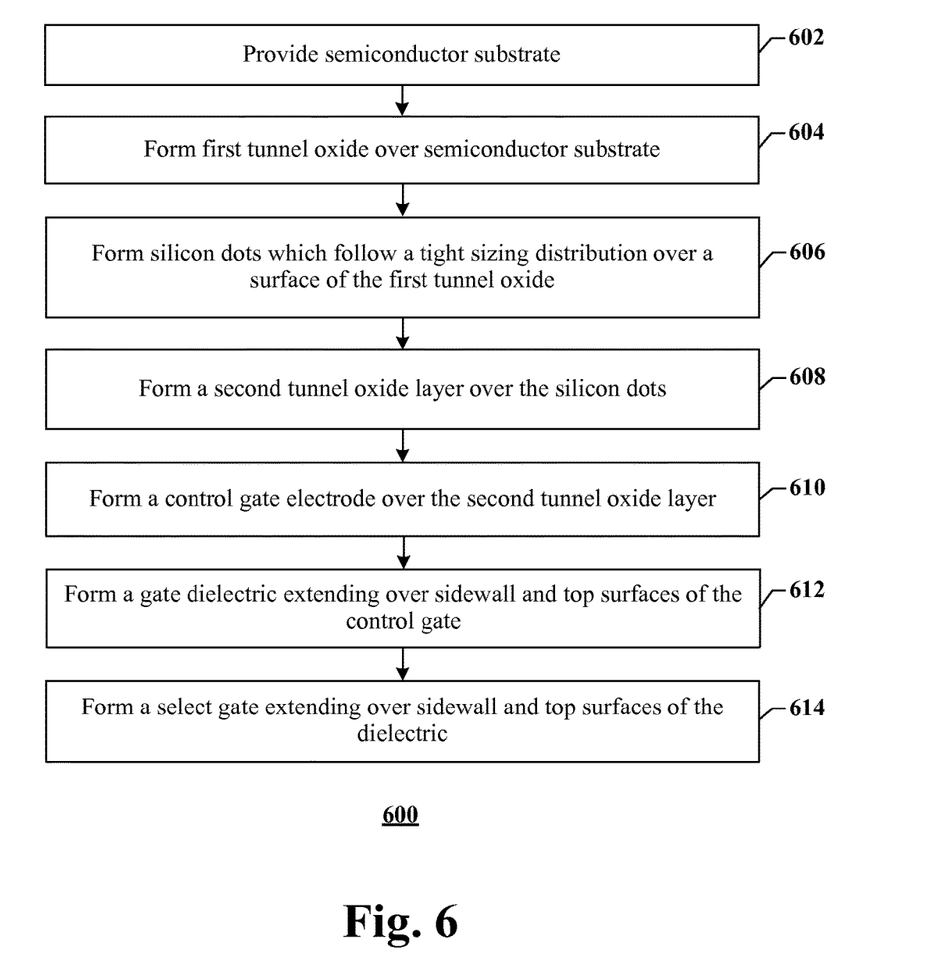
FIG. 6 illustrates a flow chart depicting a method of providing a charge trapping dielectric layer that includes Si dots in accordance with some embodiments.

FIGS. 6-22 shows some example methods of manufacturing flash memory devices that make use of silicon dots with improved size distribution. In particular, FIG. 6 shows a flow chart depicting a control gate first (select gate last) manufacturing flow, and FIGS. 7-14 show example cross-sectional views corresponding to FIG. 6's flow chart. FIG. 15 shows a flow chart depicting a select gate first (control gate last) manufacturing flow, and FIGS. 16-22 show example cross-sectional views corresponding to FIG. 15's flow chart. It will be appreciated that not all illustrated steps are necessarily required, and in other embodiments some of these steps may be omitted. Further, in other embodiments, additional process steps which are not illustrated herein may be present. Further still in other embodiments, the order of the illustrated processing steps can be re-arranged. All such embodiments are contemplated as falling with the scope of the present disclosure.

In FIG. 6, a semiconductor substrate is provided at 602. At 604, a first tunnel oxide is formed over the semiconductor substrate. At 606, silicon dots are formed over a surface of the first tunnel dielectric. These silicon dots can follow a tight uniform sizing distribution such as can be formed by the methodologies previously described in FIGS. 1-5. In 608, a second tunnel dielectric layer is formed over the silicon dots. In 610, a control gate electrode is formed over the second tunnel dielectric layer. In 612, a gate dielectric layer which extends over sidewall and top surfaces of the control gate is formed. In 614, a select gate which extends over sidewall and top surfaces of the dielectric is formed.

FIGS. 7-14 are now described below show a series of cross-sectional views consistent with the methodology of FIG. 6.

Figure 7:
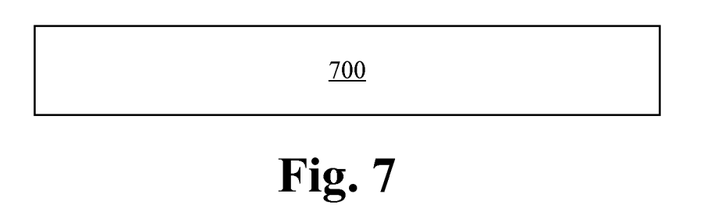
FIGS. 7-14 depict a series of cross-sectional views that collectively illustrate a method of providing a charge trapping layer that includes Si dots in accordance with some embodiments consistent with FIG. 6.

In FIG. 7, which corresponds to one example of 602 in FIG. 6, a semiconductor substrate 700 is provided.

Figure 8:
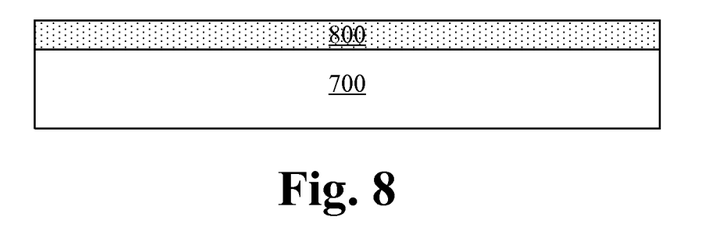

In FIG. 8, which corresponds to one example of 604 in FIG. 6, a first tunnel dielectric 800 is formed over the substrate 700. The first tunnel dielectric 800, which can be oxide such as $SiO_2$ in some embodiments, can be grown to a predetermined thickness such that the first tunnel dielectric 800 corresponds to an energetic tunnel barrier for electrons whereby electrons can quantum-mechanically tunnel from a channel region in the substrate 700 through the first tunnel dielectric 800 onto silicon dots to be formed over the first tunnel dielectric (or vice versa). For example, in some embodiments, the first tunnel dielectric 800 can be made of SiO2 having a predetermined thickness of less than 100 Angstroms.

Figure 9:
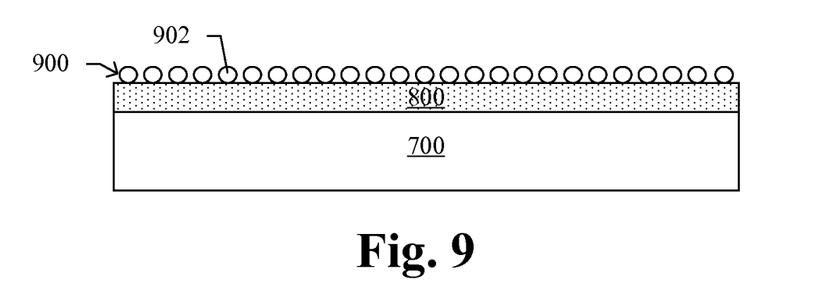

In FIG. 9, which corresponds to one example of 606 in FIG. 6, a layer of silicon dots 900 which follow a tight size distribution are formed over an upper surface of the first tunnel dielectric 800. In some embodiments, the acts previous described in FIG. 1 and/or the acts described in FIGS. 2-5 can be carried out in FIG. 9 to achieve this tight size distribution. Thus, for example, to form the layer of silicon dots 900, a layer of silicon dot nucleates can first be formed, after which an etching process can be performed to reduce the initial sizes of the silicon dot nucleates and concurrently tighten the size distribution of the nucleates. After the etching processing has taken place, a growth process can be performed to provide enlarged silicon dots 902 illustrated in FIG. 9. In some embodiments, the enlarged silicon dots 902 have diameters ranging from approximately 16 nm to approximately 24 nm. In some embodiments, such as the illustrated embodiment, the enlarged silicon dots 902 can be uniformly distributed so there are approximately equal spacings between neighboring silicon dots. However, in other embodiments, the enlarged silicon dots 902 can have different spacings therebetween. Further, the layer of silicon dots is not necessarily a single layer or mono-layer as illustrated, but can be made up of multiple layers of silicon dots that are stacked or "piled" on top of one another in a random or non-random manner.

Figure 10:
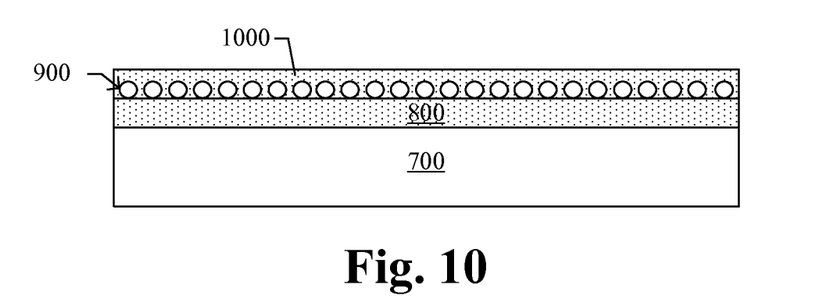

In FIG. 10, which corresponds to one example of 608 in FIG. 6, a second tunnel dielectric layer 1000 is formed over the layer of silicon dots 900. The second tunnel dielectric 1000, which can be oxide such as $SiO_2$ in some embodiments, can be grown to a predetermined thickness such that the second tunnel dielectric 1000 corresponds to an energetic tunnel barrier for electrons whereby electrons can quantum-mechanically tunnel from above the second tunnel dielectric 1000 onto the silicon dots 900 (or vice versa). In some embodiments, the second tunnel dielectric 1000 is the same thickness and material as the first tunnel dielectric 800, but the first and second tunnel dielectrics 800, 1000 could also be made of different materials and/or have different thicknesses.

Figure 11:
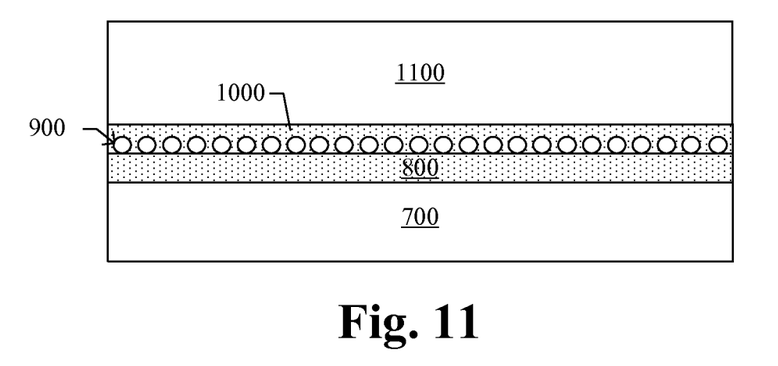

In FIG. 11, which corresponds to one example of 610 in FIG. 6, a first conductive layer 1100 is formed over the second tunnel dielectric layer 1000. In some embodiments, this first conductive layer 1100 is made of doped polysilicon, but the first conductive layer 1100 can also be a metal or metal alloy. Some examples of metal include tungsten (W), nickel (Ni), aluminum (Al), copper (Cu), gold (Au), silver (Ag), platinum (Pt), zinc (Zn), lead (Pb), tin (Sn), iron (Fe), titanium (Ti), and/or alloys of any of these metals, among others.

Figure 12:
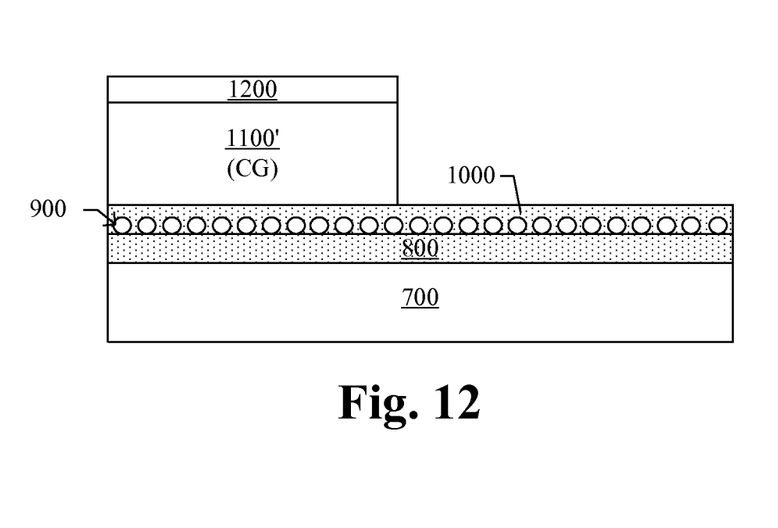

In FIG. 12, which corresponds to one example of 612 in FIG. 6, a mask 1200 is formed and patterned over the first conductive layer. Typically, this mask 1200 is formed by forming a layer of photoresist material over the first conductive layer, placing one or more photomasks over the layer of photoresist material, and exposing the layer of photoresist material to radiation that interacts with exposed portions of the layer of photoresist material. The photomask(s) are then taken away, and the layer of photoresist is developed to remove the exposed (or unexposed) portions of the layer of photoresist material, depending on whether positive or negative photoresist is used. In this way, a pattern from the photomask is transferred to the mask 1200. Other photolithographic techniques, such as e-beam lithography can also be used to pattern mask 1200. Although the mask 1200 can be a patterned layer of photoresist in some embodiments, in other embodiments the mask 1200 can be a hard mask, such as a nitride mask, an oxide mask, or some other type of mask, and can include multiple layers made of different materials. With the mask 1200 in place, an etch is carried out to transfer the pattern of the mask 1200 to the underlying conductive layer, thereby forming a control gate (CG) 1100'.

Figure 13:
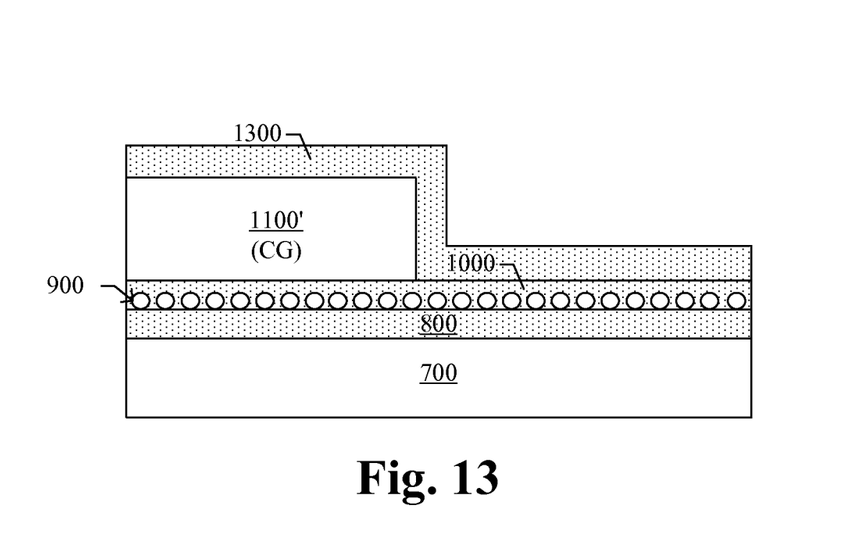

In FIG. 13, which corresponds to one example of 614 in FIG. 6, a gate dielectric layer 1300 is conformally formed over the control gate 1100'. In some embodiments, the gate dielectric layer 1300 is made of an oxide, such as silicon dioxide (SiO$_2$), which is thicker than the first and second tunnel dielectrics 800, 1000 to help limit leakage. An advantage of using SiO2 is its ease of integration into a wide variety of manufacturing flows. In other embodiments, however, the gate dielectric layer 1300 can be made of a high-k dielectric material which has a dielectric constant greater than that of SiO$_2$. An advantage of using a high-k dielectric material is that it can provide increased gate capacitance with limited or no leakage during normal memory operation, although high-k dielectric materials can be more challenging and/or expensive to integrate into manufacturing flows. Examples of high-k dielectric materials include, but are not limited to: hafnium silicate, zirconium silicate, hafnium dioxide, and zirconium dioxide, any of which can be typically deposited using atomic layer deposition (ALD) techniques, for example.

Figure 14:
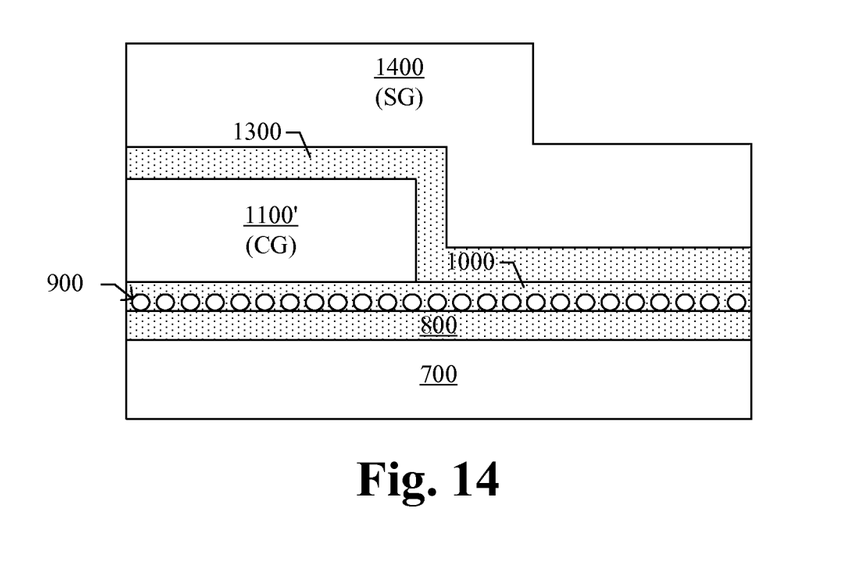
Figure 15:
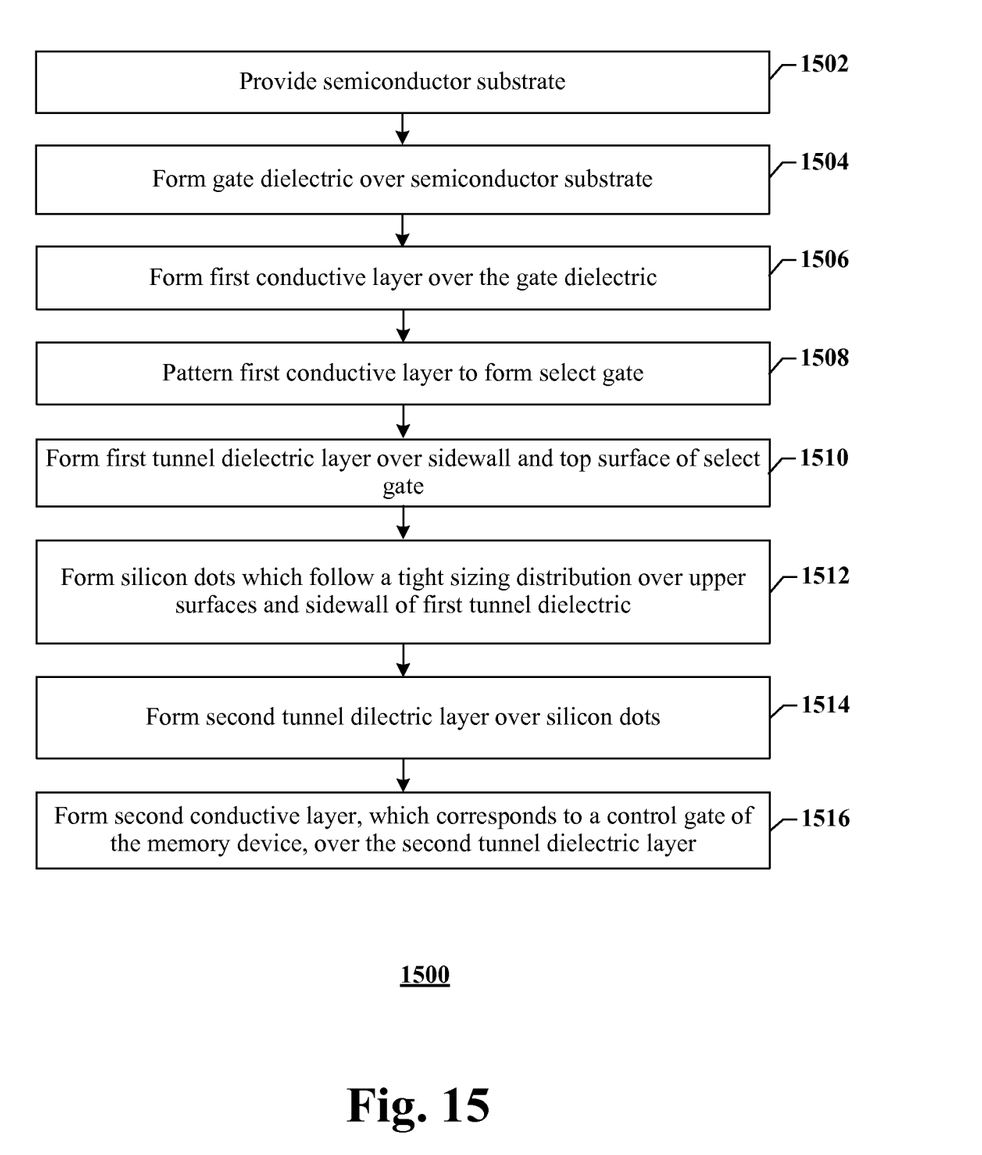
FIG. 15 illustrates a flow chart depicting a method of providing a charge trapping dielectric layer that includes Si dots in accordance with some embodiments.

In FIG. 14, which corresponds to one example of 616 in FIG. 6, a second conductive layer 1400 is formed over the gate dielectric layer 1300. In some embodiments, this second conductive layer 1400 is made of doped polysilicon, but the second conductive layer 1400 can also be a metal or metal alloy. Some examples of metal include tungsten (W), nickel (Ni), aluminum (Al), copper (Cu), gold (Au), silver (Ag), platinum (Pt), zinc (Zn), lead (Pb), tin (Sn), iron (Fe), titanium (Ti), and/or alloys of any of these metals, among others. The second conductive layer 1400 corresponds to a select gate (SG) of the memory device.

Turning now to FIG. 15, a flow chart depicting a select gate first (control gate last) manufacturing flow is illustrated. In FIG. 15, a semiconductor substrate is provided at 1502. At 1504, a gate dielectric is formed over the semiconductor substrate. At 1506, a first conductive layer is formed over the gate dielectric. At 1508, the first conductive layer is patterned to form a select gate. In 1510, a first tunnel dielectric is formed over the select gate. In 1512, a layer of silicon dots are formed over upper surfaces and sidewalls of the first tunnel dielectric. These silicon dots can follow a tight uniform sizing distribution such as can be formed by the methodologies previously described in FIGS. 1-5. In 1514, a second tunnel dielectric layer is formed over the silicon dots. In 1516, a control gate electrode is formed over the second tunnel dielectric layer.

FIGS. 16-22 are now described below show a series of cross-sectional views consistent with the methodology of FIG. 15.

Figure 16:
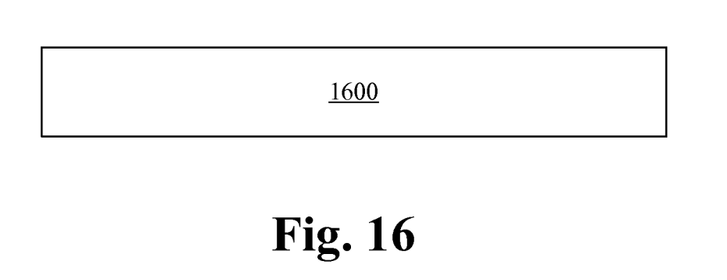
FIGS. 16-23 depict a series of cross-sectional views that collectively illustrate a method of providing a charge trapping layer that includes Si dots in accordance with some embodiments consistent with FIG. 15.

In FIG. 16, which corresponds to one example of 1502 in FIG. 15, a semiconductor substrate 1600 is provided.

Figure 17:
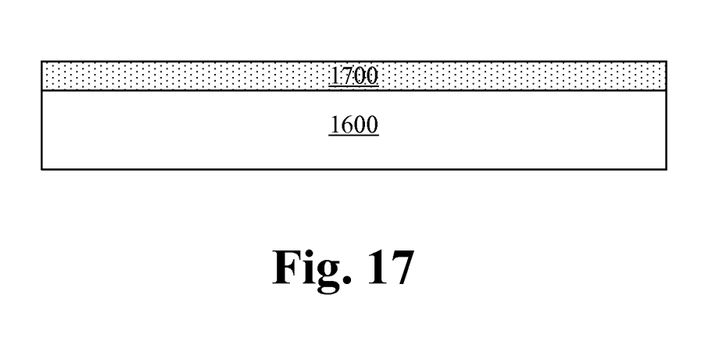

In FIG. 17, which corresponds to one example of 1504 in FIG. 15, a gate dielectric layer 1700 is formed over the substrate 1600. In some embodiments, the gate dielectric layer 1700 is made of an oxide, such as silicon dioxide (SiO$_2$). In other embodiments, however, the gate dielectric layer 1700 can be made of a high-k dielectric material which has a dielectric constant greater than that of SiO$_2$.

Figure 18:
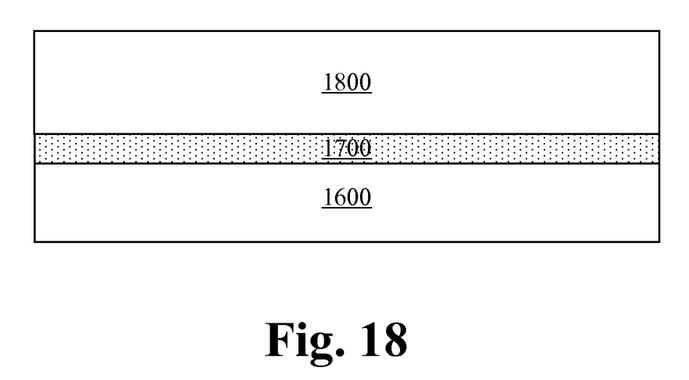

In FIG. 18, which corresponds to one example of 1506 in FIG. 15, a first conductive layer 1800 is formed over the gate dielectric layer 1700. In some embodiments, this first conductive layer 1800 made of doped polysilicon, but the first conductive layer 1800 can also be a metal or metal alloy. Some examples of metal include tungsten (W), nickel (Ni), aluminum (Al), copper (Cu), gold (Au), silver (Ag), platinum (Pt), zinc (Zn), lead (Pb), tin (Sn), iron (Fe), titanium (Ti), and/or alloys of any of these metals, among others.

Figure 19:
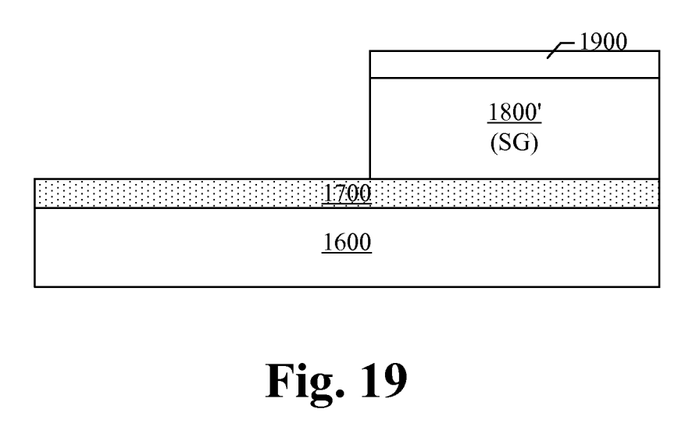

In FIG. 19, which corresponds to one example of 1508 in FIG. 15, a mask 1900 is formed and patterned over the first conductive layer. Typically, this mask 1900 is formed by forming a layer of photoresist material over the first conductive layer, placing one or more photomasks over the layer of photoresist material, exposing the layer of photoresist material to radiation that interacts with exposed portions of the layer of photoresist material. The photomask(s) are then taken away, and the layer of photoresist is developed to remove the exposed (or unexposed) portions of the layer of photoresist material, depending on whether positive or negative photoresist is used. In this way, a pattern from the photomask is transferred to the mask 1900. Other photolithographic techniques, such as e-beam lithography can also be used to pattern mask 1900. Although the mask 1900 can be a patterned layer of photoresist in some embodiments, in other embodiments the mask 1900 can be a hard mask, such as a nitride mask, an oxide mask, or some other type of mask, and can include multiple layers made of different materials. With the mask 1900 in place, an etch is carried out to transfer the pattern of the mask to the underlying first conductive layer, thereby forming a select gate (SG) 1800'.

Figure 20:
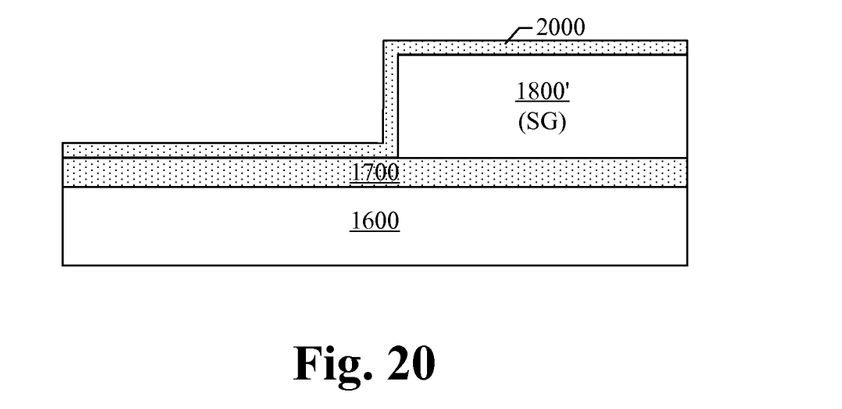

In FIG. 20, which corresponds to one example of 1510 in FIG. 15, a first tunnel dielectric 2000 is formed over the gate dielectric 1700 and SG 1800'. The first tunnel dielectric 2000, which can be oxide such as SiO$_2$ in some embodiments, can be grown to a predetermined thickness such that the first tunnel dielectric 2000 corresponds to an energetic tunnel barrier for electrons whereby electrons can quantum-mechanically tunnel from the SG 1800' to silicon dots to be formed over the first tunnel dielectric 2000 (or vice versa). The first tunnel dielectric 2000 is often thinner than the gate dielectric 1700, having a thickness of less than 100 Angstroms in some embodiments.

Figure 21:
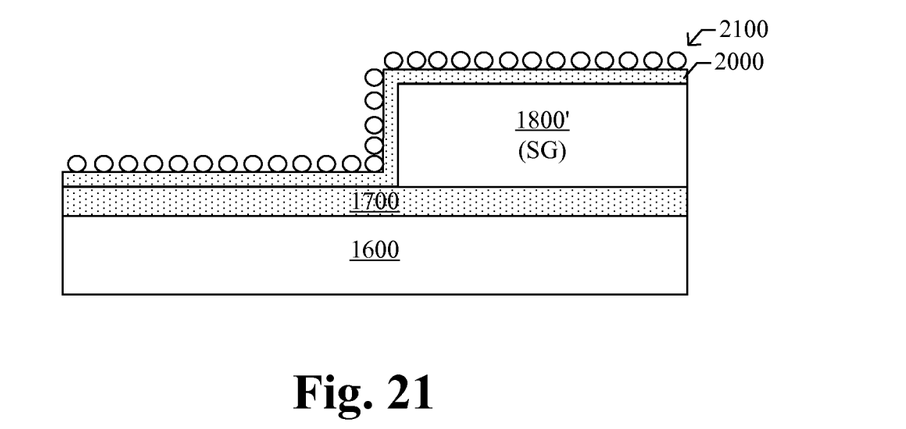

In FIG. 21, which corresponds to one example of 1512 in FIG. 15, a layer of silicon dots 2100 which follow a tight size distribution are formed over upper surfaces and sidewalls of the first tunnel dielectric 2000. In some embodiments, the acts previous described in FIG. 1 and/or the acts described in FIGS. 2-5 can be carried out in FIG. 21 to achieve this tight size distribution. Thus, for example, to form the layer of silicon dots in FIG. 21, a layer of silicon dot nucleates can first be formed, after which an etching process can be performed to reduce the initial sizes of the silicon dot nucleates and concurrently tighten the size distribution of the nucleates. After the etching processing has taken place, a growth process can be performed to provide enlarged silicon dots 2002 illustrated in FIG. 21. In some embodiments, the enlarged silicon dots 2002 have diameters ranging from approximately 16 nm to approximately 24 nm. In some embodiments, such as the illustrated embodiment, the enlarged silicon dots 2102 can be uniformly disbursed so there are approximately equal spacings between neighboring enlarged silicon dots, however, in other embodiments the enlarged silicon dots 2012 can have different spacings therebetween. Further, the layer of silicon dots 2100 is not necessarily a single layer or mono-layer as illustrated, but can be made up of multiple layers of silicon dots that are stacked or "piled" on top of one another in a random or non-random manner.

Figure 22:
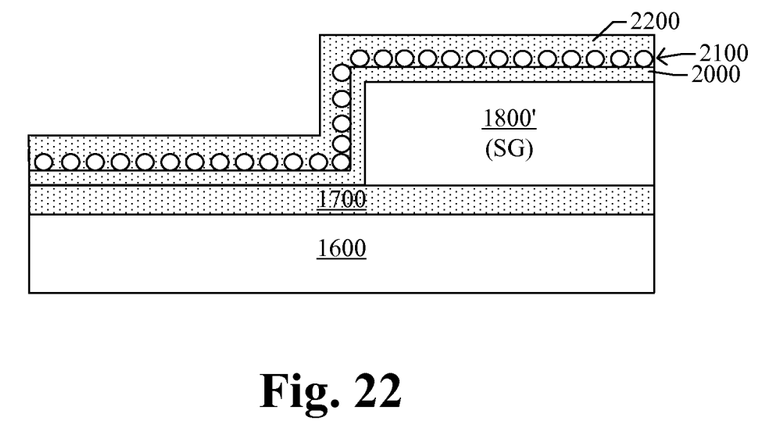

In FIG. 22, which corresponds to one example of 1514 in FIG. 15, a second tunnel dielectric layer 2200 is formed over the layer of silicon dots 2100. The second tunnel dielectric 2200, which can be oxide such as SiO$_2$ in some embodiments, can be grown to a predetermined thickness such that the second tunnel dielectric 2200 corresponds to an energetic tunnel barrier for electrons whereby electrons can quantum-mechanically tunnel from over the second tunnel dielectric 2200 onto the layer of silicon dots 2100 (or vice versa). In some embodiments, the second tunnel dielectric 2200 is the same thickness and material as the first tunnel dielectric 2000, but the first and second tunnel dielectrics 2000, 2200 could also be made of different materials and/or have different thicknesses.

Figure 23:
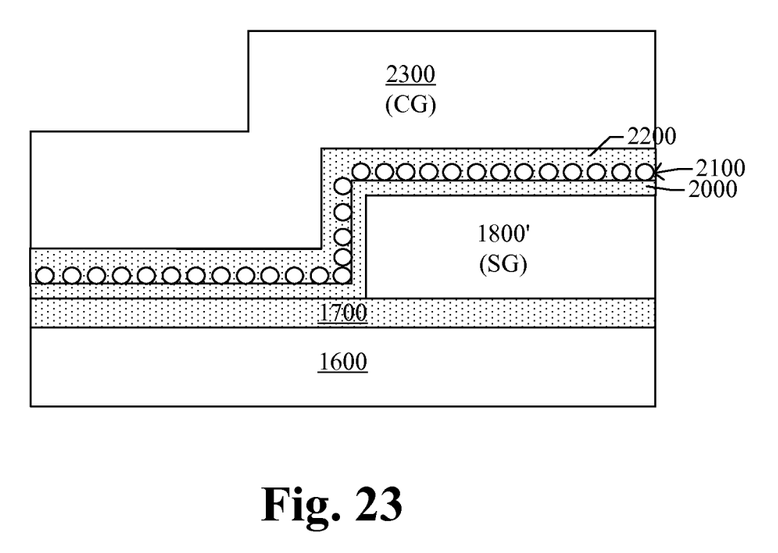

In FIG. 23, which corresponds to one example of 1516 in FIG. 15, a second layer of conductive material 2300 is formed over the second tunnel dielectric layer 2200. In some embodiments, this second conductive layer 2300 is made of doped polysilicon, but the second conductive layer 2300 can also be a metal or metal alloy. Some examples of metal include tungsten (W), nickel (Ni), aluminum (Al), copper (Cu), gold (Au), silver (Ag), platinum (Pt), zinc (Zn), lead (Pb), tin (Sn), iron (Fe), titanium (Ti), and/or alloys of any of these metals, among others. The second layer of conductive material 2300 corresponds to a control gate (CG) of the memory device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming flash memory, comprising:
    forming a tunnel oxide over a semiconductor substrate;
    forming a layer of silicon dot nucleates on the tunnel oxide, wherein the layer of silicon dot nucleates includes silicon dot nucleates having respective initial sizes which differ according to a first size distribution having a first spread;
    performing an etching process to reduce the initial sizes of the silicon dot nucleates so reduced-size silicon dot nucleates have respective reduced sizes which differ according to a second size distribution having a second spread, wherein the etching process comprises:
        flowing a precursor gas of $SiH_4$ or $Si_2H_6$ at a gas flow rate of less than 100 sccm, flowing a carrier gas of Ar or $N_2$ at a gas flow rate of less than 20000 sccm, while a pressure of less than approximately 200 Torr. is applied to the layer of silicon dot nucleates during the etching process, resulting in the second spread being less than the first spread; and
    forming an oxide layer over and in contact with the layer of silicon dot nucleates after the etching process has been performed.

2. The method of claim 1, wherein the second spread is approximately 40% or approximately 60% of the first spread.

3. The method of claim 1, further comprising:
    after the etching process has been performed and prior to the forming of the oxide layer, performing a growth process to enlarge the reduced sizes of the reduced-size silicon dot nucleates so enlarged silicon dots have respective enlarged sizes that are larger than the initial sizes.

4. The method of claim 3, wherein the enlarged silicon dots have a third size distribution that has a third spread that is smaller than the first spread, wherein the third spread is less than the first spread.

5. The method of claim 4, wherein the third spread is approximately equal to the second spread.

6. The method of claim 3, wherein individual initial silicon dot nucleates have diameters that range from approximately 3 nm to approximately 10 nm.

7. The method of claim 6, wherein the reduced size silicon dot nucleates have diameters that range from approximately 3 nm to approximately 6 nm.

8. The method of claim 7, wherein the enlarged silicon dots have diameters that range from approximately 16 nm to approximately 24 nm.

9. The method of claim 1, wherein the etching process comprises a dry etch, a plasma etch, or a low pressure chemical vapor deposition process.

10. The method of claim 4, wherein the third spread is approximately 40% or approximately 60% of the first spread.

11. The method of claim 3, wherein the growth process comprises:
    flowing a precursor gas of SiH4 or $Si_2H_6$ at a flow rate of less than approximately 200 sccm, flowing a carrier gas of Helium at flow at less than 2000 sccm, while a pressure of less than approximately 100 Torr. is applied to the layer of silicon dot nucleates during the growth process.

12. The method of claim 1, wherein forming the layer of silicon dot nucleates comprises a dry etch, a plasma etch, or a low pressure chemical vapor deposition process.

13. The method of claim 1, wherein the oxide layer formed over the layer of silicon dot nucleates is thicker than the tunnel oxide.

14. A method for forming a flash memory, comprising:
    forming a first oxide over a semiconductor substrate;
    forming silicon dot nucleates on the first oxide, wherein a first silicon dot nucleate of the silicon dot nucleates has a first diameter and a second silicon dot nucleate of the silicon dot nucleates has a second diameter, the first diameter being smaller than the second diameter; wherein the silicon dot nucleates when initially formed have respective initial sizes that differ according to a first size distribution having a first spread;
    performing an etching process to reduce sizes of the silicon dot nucleates to eliminate the first silicon dot nucleate while reducing the second diameter of the second silicon dot nucleate to a reduced diameter, thereby providing reduced-size silicon dot nucleates that follow a second size distribution having a second spread that is smaller than the first spread;
    after the etching process, performing a growth process to enlarge the reduced-size silicon dot nucleates to have enlarged diameters that are larger than the second diameter, thereby providing enlarged-size silicon dot nucleates that follow a third size distribution having a third spread; and
        flowing a precursor gas of SiH4 or $Si_2H_6$ at a flow rate of less than approximately 200 sccm, flowing a carrier gas of Helium at flow at less than 2000 sccm, while a pressure of less than approximately 100 Torr. is applied to the layer of silicon dot nucleates during the growth process, resulting in the third spread being less than the first spread; and
    forming a second oxide layer over the enlarged-size silicon dot nucleates.

15. The method of claim 14, wherein the first spread is approximately 50%, and the second and third spreads are approximately 30%.

16. The method of claim 14, wherein the second oxide layer is thicker than the first oxide.

17. A method, comprising:
forming a first dielectric over a semiconductor substrate;
forming a layer of silicon dot nucleates on the first dielectric, wherein the layer of silicon dots includes silicon dot nucleates having respective initial sizes which differ according to a first size distribution having a first spread;
performing an etching process to reduce the initial sizes of the silicon dot nucleates so reduced-size silicon dot nucleates have respective reduced sizes which differ according to a second size distribution having a second spread, wherein the etching process comprises:
flowing a precursor gas of $SiH_4$ or $Si_2H_6$ at a gas flow rate of less than 100 sccm, flowing a carrier gas of Ar or $N_2$ at a gas flow rate of less than 20000 sccm, while a pressure of less than approximately 200 Torr. is applied to the layer of silicon dot nucleates during the etching process, resulting in the second spread being less than the first spread;
after the etching process has been performed, performing a growth process to enlarge the reduced sizes of the reduced-size silicon dot nucleates so enlarged silicon dots have respective enlarged sizes which differ according to a third size distribution having a third spread, wherein the growth process comprises:
flowing a precursor gas of SiH4 or $Si_2H_6$ at a flow rate of less than approximately 200 sccm, flowing a carrier gas of Helium at flow at less than 2000 sccm, while a pressure of less than approximately 100 Torr. is applied to the layer of silicon dot nucleates during the growth process, resulting in the third spread being less than the first spread; and
forming a second dielectric over the layer of silicon dot nucleates after the etching process has been performed, wherein the second dielectric is thicker than the first dielectric.

18. The method of claim 17, wherein the third spread is approximately equal to the second spread.

19. The method of claim 18, wherein the enlarged silicon dots have respective diameters ranging from approximately 16 nm to approximately 24 nm and wherein the enlarged silicon dots have substantially zero silicon dots having diameters of less than 3 nm and have substantially zero silicon dots having diameters of greater than 37 nm.

20. The method of claim 18, further comprising:
forming a conductive gate over the second dielectric, wherein the conductive gate is separated from the enlarged silicon dots by the second dielectric.

* * * * *